United States Patent
Lee et al.

(10) Patent No.: US 10,506,706 B2
(45) Date of Patent: Dec. 10, 2019

(54) PRINTED CIRCUIT BOARD INCLUDING WARPAGE OFFSET REGIONS AND SEMICONDUCTOR PACKAGES INCLUDING THE SAME

(71) Applicant: SAMSUNG ELECTRONICS CO., LTD., Suwon-si, Gyeonggi-do (KR)

(72) Inventors: Shle-Ge Lee, Seoul (KR); Youngbae Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/966,762

(22) Filed: Apr. 30, 2018

(65) Prior Publication Data

US 2019/0124761 A1    Apr. 25, 2019

(30) Foreign Application Priority Data

Oct. 24, 2017   (KR) ................. 10-2017-0138563

(51) Int. Cl.
| | |
|---|---|
| H05K 1/02 | (2006.01) |
| H01L 23/498 | (2006.01) |
| H01L 23/00 | (2006.01) |
| H01L 25/065 | (2006.01) |
| H01L 23/31 | (2006.01) |

(52) U.S. Cl.
CPC ..... *H05K 1/0271* (2013.01); *H01L 23/49816* (2013.01); *H01L 23/562* (2013.01); *H01L 25/0657* (2013.01); *H01L 23/3128* (2013.01); *H01L 2224/16225* (2013.01); *H01L 2224/32225* (2013.01); *H01L 2224/48227* (2013.01); *H01L 2224/73265* (2013.01); *H01L 2924/15311* (2013.01); *H01L 2924/3511* (2013.01)

(58) Field of Classification Search
CPC ............ H01L 23/562; H01L 23/49816; H01L 2924/3511; H05K 1/0271
See application file for complete search history.

(56) References Cited

U.S. PATENT DOCUMENTS

| | | | |
|---|---|---|---|
| 5,912,654 | A | 6/1999 | Ouchi et al. |
| 6,087,717 | A | 7/2000 | Ano et al. |
| 6,864,434 | B2 | 3/2005 | Chang et al. |
| 7,387,945 | B2 | 6/2008 | Hara |
| 7,965,497 | B2 | 6/2011 | Kwon et al. |
| 8,014,154 | B2 | 9/2011 | Lee |
| 8,232,642 | B2 | 7/2012 | Kim et al. |
| 8,703,535 | B2 | 4/2014 | Kim et al. |
| 9,478,500 | B2 | 10/2016 | Chen et al. |

(Continued)

*Primary Examiner* — Yosef Gebreyesus
(74) *Attorney, Agent, or Firm* — Sughrue Mion, PLLC

(57) ABSTRACT

A printed circuit board can include a base layer, a first surface and a second surface opposite to each other. A first routing layer can be on the first surface and a second routing layer can be on the second surface, the first routing layer can be provided at an upper part of each of the first and second regions and the second routing layer can be provided at a lower part of each of the first and second regions. The upper part of the first region can have a first line-area ratio, the upper part of the second region can have a second line-area ratio, the lower part of the first region can have a third line-area ratio, the lower part of the second region can have a fourth line-area ratio, the second and third line-area ratios can be greater than each of the first and fourth line-area ratios.

20 Claims, 11 Drawing Sheets

(56) References Cited

U.S. PATENT DOCUMENTS

| | | |
|---|---|---|
| 2006/0152869 A1* | 7/2006 | Su .................... H05K 1/0259 361/56 |
| 2008/0182398 A1* | 7/2008 | Carpenter ............ H01L 23/13 438/612 |
| 2009/0289350 A1 | 11/2009 | Watanabe |
| 2016/0079201 A1 | 3/2016 | Do et al. |
| 2017/0178987 A1 | 6/2017 | Kumar et al. |

* cited by examiner

PRINTED CIRCUIT BOARD INCLUDING WARPAGE OFFSET REGIONS AND SEMICONDUCTOR PACKAGES INCLUDING THE SAME

CROSS-REFERENCE TO RELATED APPLICATION

This U.S. non-provisional patent application claims priority under 35 U.S.C. § 119 of Korean Patent Application No. 10-2017-0138563 filed on Oct. 24, 2017, the entire contents of which are hereby incorporated herein by reference.

BACKGROUND

Inventive concepts relate to a printed circuit board and a semiconductor package including the same, and more particularly, to a printed circuit board having a plurality of routing layers and a semiconductor package including the same.

Typically, in a semiconductor package, a semiconductor chip is mounted on a printed circuit board (PCB), and bonding wires or bumps are used to electrically connect the semiconductor chip to the printed circuit board. With the development of electronic industry, there has been an increasing need for improvement in performance, speed, and size of electronic products.

SUMMARY

Embodiments of inventive concepts can provide a printed circuit board including warpage offset regions and semiconductor packages including the same. In some embodiments, a printed circuit board can include a first region and a second region sharing a border with each other. The printed circuit board can further include a base layer including a first surface and a second surface that are opposite to each other. A first routing layer can be on the first surface and a second routing layer can be on the second surface, where the first routing layer can be provided at an upper part of each of the first and second regions and the second routing layer can be provided at a lower part of each of the first and second regions. The upper part of the first region can have a first line-area ratio, the upper part of the second region can have a second line-area ratio, the lower part of the first region can have a third line-area ratio, and the lower part of the second region can have a fourth line-area ratio, where each of the second and third line-area ratios can be greater than each of the first and fourth line-area ratios.

In some embodiments, a printed circuit board can be divided into a plurality of regions, where the printed circuit board can include a base layer including a first surface and a second surface that are opposite to each other. A first routing layer can include a plurality of first lines on the first surface and a second routing layer can include a plurality of second lines on the second surface, wherein the plurality of regions can include a first region and a second region sharing a border with each other. An area ratio of an area of first lines in the first region to an area of the first region can be less than an area ratio of the first lines in the second region to an area of the second region. An area ratio of an area of the second lines in the first region to the area of the first region can be greater than an area ratio of an area of the second lines in the second region to the area of the second region.

In some embodiments, a semiconductor package can include a printed circuit board including a plurality of regions that are adjacent to each other and a semiconductor chip on the printed circuit board, where the printed circuit board can include a base layer having a first surface and a second surface opposite to each other. A first routing layer include a plurality of first lines on the first surface and a second routing layer including a plurality of second lines on the second surface, wherein the plurality of regions can include a first region and a second region adjacent to each other and sharing a border with each other. An area ratio of an area of the first lines in the first region to area of the first region can be less than an area ratio of an area of the second lines in the first region to the area of the first region. An area ratio of an area of the first lines in the second region to an area of the second region can be greater than an area ratio of an area of the second lines in the second region to an area of the second region.

DETAILED DESCRIPTION OF EMBODIMENTS

Figure 1:
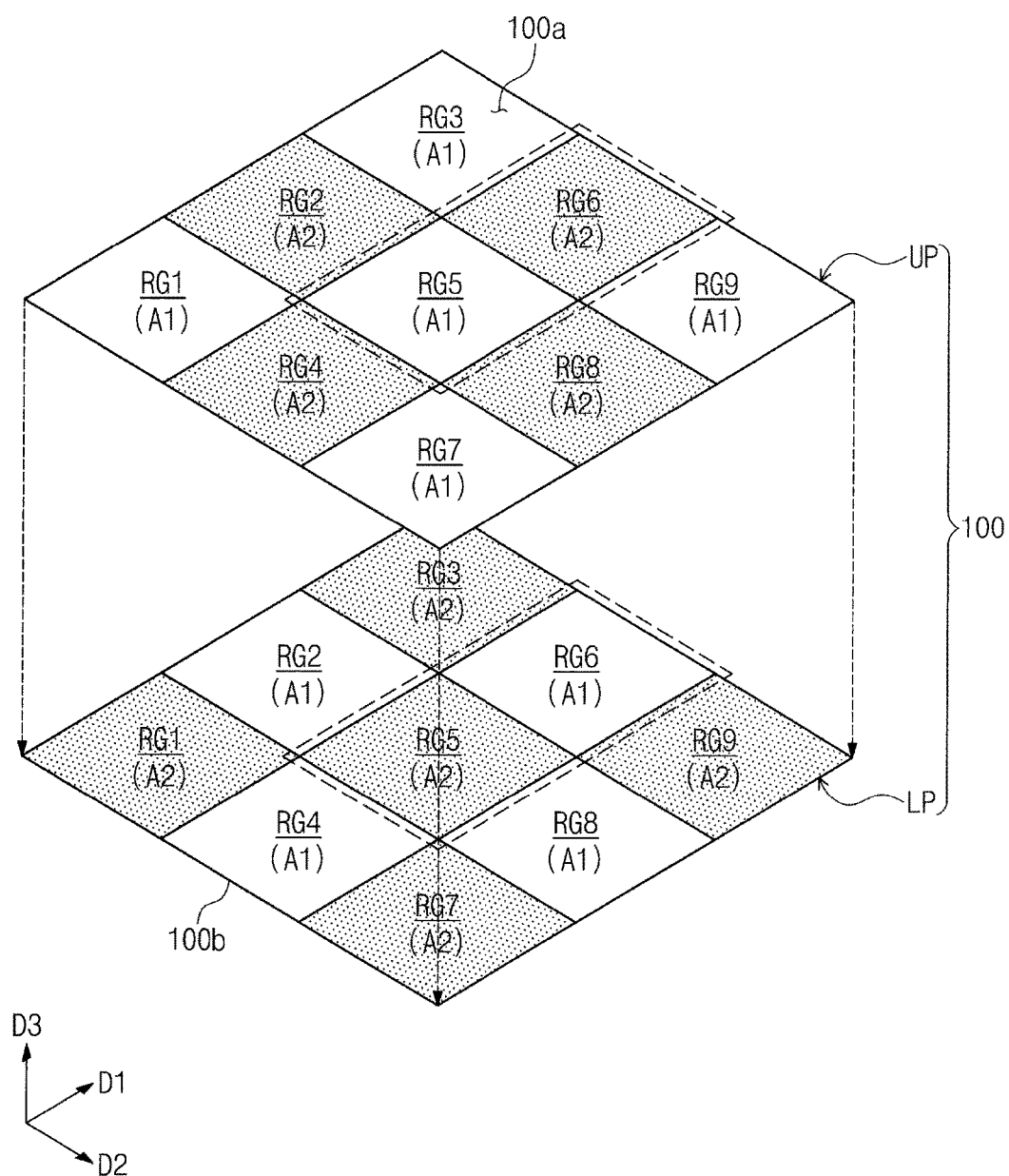
FIG. 1 illustrates a perspective view showing a printed circuit board according to exemplary embodiments of inventive concepts.
Figure 2A:
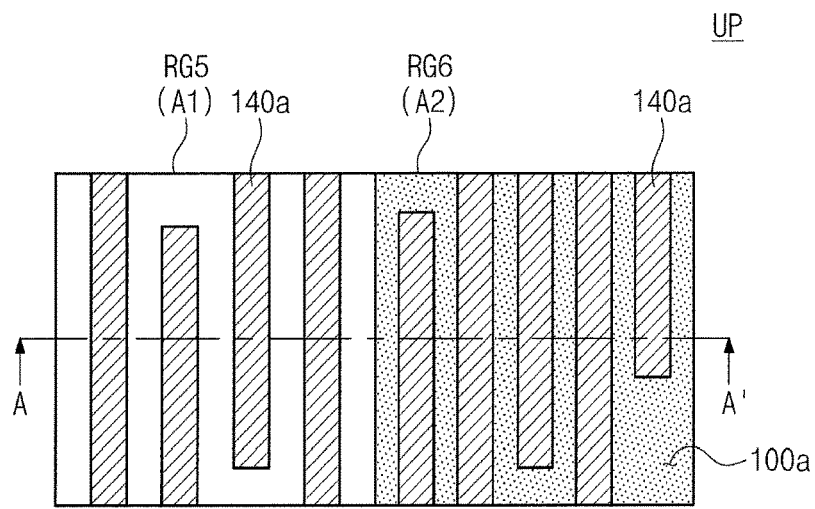
FIG. 2A illustrates a plan view showing fifth and sixth regions at an upper part of the printed circuit board shown in FIG. 1.
Figure 2B:
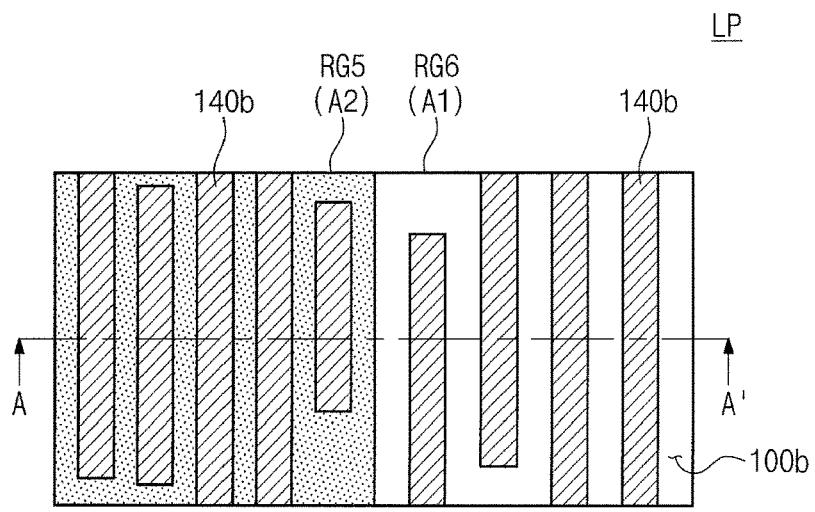
FIG. 2B illustrates a plan view showing fifth and sixth regions at a lower part of the printed circuit board shown in FIG. 1.
Figure 3:
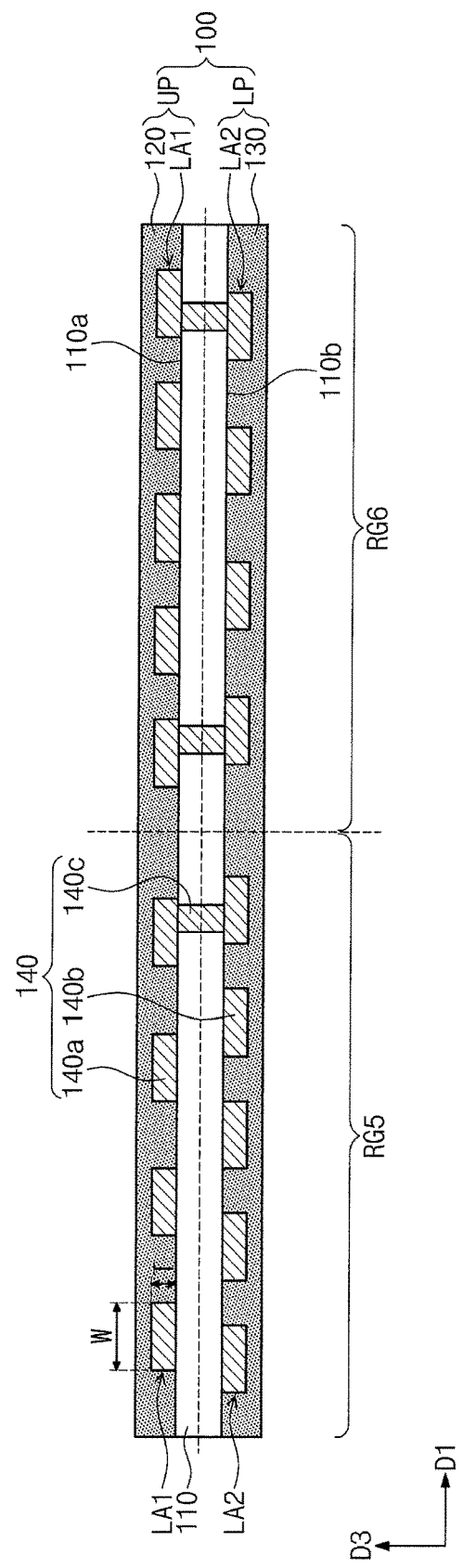
FIG. 3 illustrates a cross-sectional view taken along line A-A' of FIGS. 2A and 2B.
Figure 4:
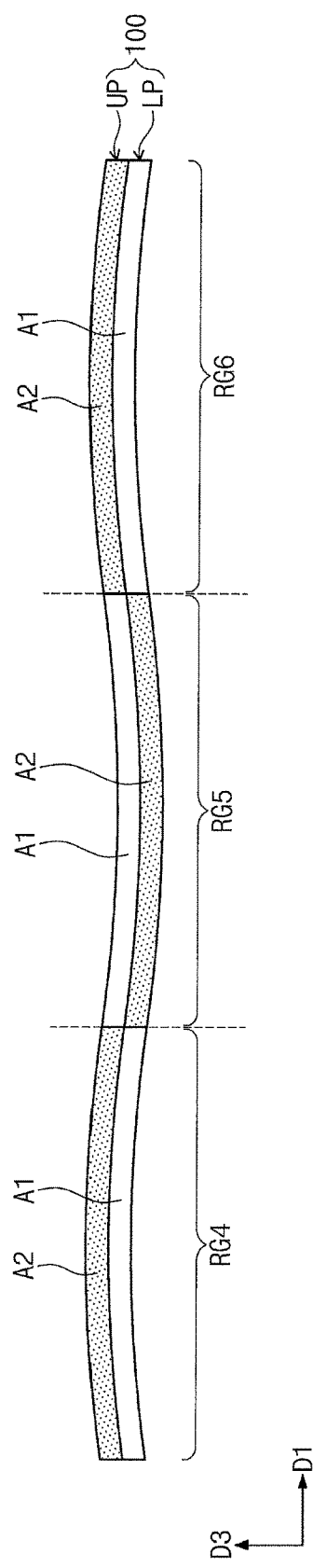
FIG. 4 illustrates a cross-sectional view showing warpage of a printed circuit board according to exemplary embodiments of inventive concepts.
Figure 5:
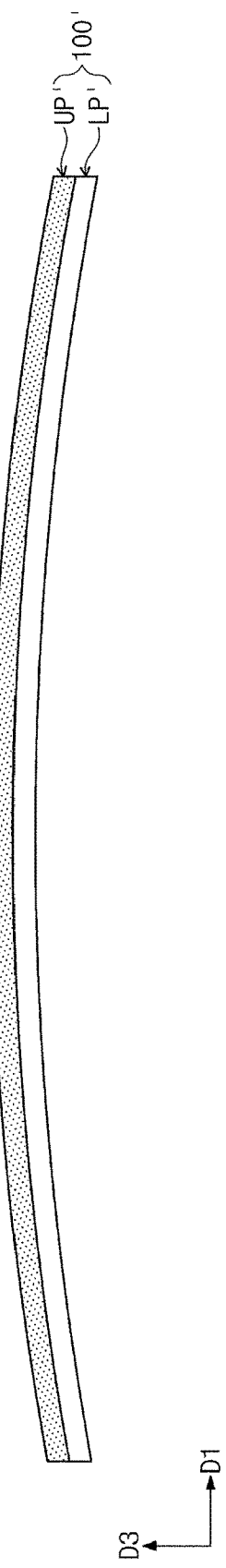
FIG. 5 illustrates a cross-sectional view showing warpage of a printed circuit board according to a comparative example of inventive concepts.

FIG. 1 illustrates a perspective view showing a printed circuit board according to exemplary embodiments of inventive concepts. FIG. 2A illustrates a plan view showing fifth and sixth regions at an upper part of the printed circuit board shown in FIG. 1. FIG. 2B illustrates a plan view showing fifth and sixth regions at a lower part of the printed circuit board shown in FIG. 1. FIG. 3 illustrates a cross-sectional view taken along line A-A' of FIGS. 2A and 2B. FIG. 4 illustrates a cross-sectional view showing warpage of a printed circuit board according to exemplary embodiments of inventive concepts. FIG. 5 illustrates a cross-sectional view showing warpage of a printed circuit board according to a comparative example of inventive concepts. Unless explicitly indicated herein, as used herein all numbers include a +/−range of about that number.

Referring to FIGS. 1 2A, 2B, 3, and 4, a printed circuit board 100 may include first to ninth regions RG1 to RG9. The printed circuit board 100 may be divided into nine sections, and the divided nine sections may be defined as the first to ninth regions RG1 to RG9. For example, the first to ninth regions RG1 to RG9 may have the same planar size as each other. Alternatively, the first to ninth regions RG1 to RG9 may have different planar sizes from each other. When viewed in a plan view, each of the first to ninth regions RG1 to RG9 may have a rectangular shape. In some embodiments, the first to ninth regions RG1 to RG9 can have similar shapes and sizes (i.e., areas).

The first to ninth regions RG1 to RG9 may be two-dimensionally arranged in a first direction D1 and a second direction D2. The present embodiment sets forth that the printed circuit board 100 has the first to ninth regions RG1 to RG9, but the printed circuit board 100 may be divided into, but not specially limited to, regions more than nine. The printed circuit board 100 according to some embodiments may include at least nine regions RG1 to RG9.

The printed circuit board 100 may include an upper part UP and a lower part LP. The first, third, fifth, seventh, and ninth regions RG1, RG3, RG5, GR7, and RG9 at the upper part UP of the printed circuit board 100 may be called first deformation regions A1. The second, fourth, sixth, and eighth regions RG2, RG4, RG6, and GR8 at the upper part UP of the printed circuit board 100 may be called second deformation regions A2.

The regions A1 and A2 can be arranged on the printed circuit board 100 in a checkerboard pattern. For example, as shown in FIG. 1, each of the first deformation regions A1 may be surrounded (on each side) by second deformation regions A2 and each of the second deformation regions A2 may be surrounded (on each side) by first deformation regions A1. Accordingly, each of the first deformation regions A1 can share at least one border with a second deformation region A2 and each of the second deformation regions A2 can share at least one border with a first deformation region A1.

The first and second deformation regions A1 and A2 at the upper part UP may be alternately arranged along the first direction D1. The first and second deformation regions A1 and A2 at the upper part UP may also be alternately arranged along the second direction D2. One of a pair of neighboring regions A1 and A2 may be the first deformation region A1, and the other of the pair of neighboring regions A1 and A2 may be the second deformation region A2.

The second, fourth, sixth, and eighth regions RG2, RG4, RG6, and GR8 at the lower part LP of the printed circuit board 100 may be called the first deformation regions A1. The first, third, fifth, seventh, and ninth regions RG1, RG3, RG5, GR7, and RG9 at the lower part LP of the printed circuit board 100 may be called the second deformation regions A2. Likewise the arrangement of the first and second deformation regions A1 and A2 at the upper part UP of the printed circuit board 100, the first and second deformation regions A1 and A2 at the lower part LP of the printed circuit board 100 may be alternately arranged.

The arrangement of the first and second deformation regions A1 and A2 at the lower part LP of the printed circuit board 100 may be opposite to the arrangement of the first and second deformation regions A1 and A2 at the upper part UP of the printed circuit board 100. For example, each of the first, third, fifth, seventh, and ninth regions RG1, RG3, RG5, RG7, and GR9 may include the first deformation region A1 at the upper part UP, and include the second deformation region A2 at the lower part LP. Each of the second, fourth, sixth, and eighth regions RG2, RG4, RG6, and RG8 may include the second deformation region A2 at the upper part UP, and include the first deformation region A1 at the lower part LP.

The first deformation regions A1 may be thermally deformed more than the second deformation regions A2. The first deformation regions A1 may have thermal strain greater than that of the second deformation regions A2. For example, a routing layer on one of the first deformation regions A1 may have an area ratio less than that of a routing layer on the second deformation region A2 adjacent to the one of the first deformation regions A1. The thermal strain may mean the deformation degree of a relevant region when the printed circuit board 100 is heated during manufacture of a semiconductor package. For example, the thermal strain may indicate the degree of increase in horizontal length of the relevant region.

The fifth and sixth regions RG5 and RG6 of the printed circuit board 100 will be representatively discussed in detail below with reference to FIGS. 2A, 2B, and 3.

The printed circuit board 100 may include a base layer 110, a first insulation layer 120, a second insulation layer 130, and lines 140. The base layer 110 may have a first surface 110*a* and a second surface 110*b* opposite to each other. The first insulation layer 120 may be provided on the first surface 110*a* of the base layer 110, and the second insulation layer 130 may be provided on the second surface 110*b* of the base layer 110.

The base layer 110 may include one or more of phenol resin, epoxy resin, and polyimide. For example, the base layer 110 may include one or more of FR4 (flame retardant 4), tetrafunctional epoxy, polyphenylene ether, epoxy/polyphenylene oxide, BT (bismaleimide triazine), thermount, cyanate ester, polyimide, and liquid crystal polymer.

For example, either screen printing or spray coating may be employed to entirely coat photo-imageable solder resist, and thus each of the first and second insulation layers 120 and 130 may be formed. Alternatively, each of the first and second insulation layers 120 and 130 may be formed by laminating a film-type solder resist, performing exposure and development processes to remove an unnecessary portion of the film-type solder resist, and then curing the film-type solder resist by heat, UV, or IR.

Each of the first and second insulation layers 120 and 130 may have an opening that exposes at least a portion of the line 140. The exposed at least a portion of the line 140 may be a pad of the printed circuit board 100.

The lines 140 may include first lines 140*a* on the first surface 110*a* of the base layer 110, second lines 140*b* on the second surface 110*b* of the base layer 110, and vias 140*c* in the base layer 110. Each of the vias 140*c* may vertically connect one of the first lines 140*a* to one of the second lines 140*b*.

The first lines 140*a* may constitute a first routing layer LA1, and the second lines 140*b* may constitute a second routing layer LA2. The present embodiment shows the printed circuit board 100 including two routing layers (or the first routing layer LA1 and the second routing layer LA2), but in other embodiments, the printed circuit board 100 may further include at least one additional routing layer. For example, an additional base layer may further be provided between the first routing layer LA1 and the second routing layer LA2, and a third routing layer may further be provided in the additional base layer (see FIG. 8).

The upper part UP of the printed circuit board 100 may include the first routing layer LA1 including the first insulation layer 120 and the first lines 140*a*. The lower part LP of the printed circuit board 100 may include the second routing layer LA2 consisting of the second insulation layer 130 and the second lines 140b.

Each of the first lines 140a may have substantially the same thickness (T) as that of each of the second lines 140b. An average pattern width (W) of the first lines 140a may be substantially the same as an average pattern width of the second lines 140b. The first lines 140a, the second lines 140b, and the vias 140c may include the same metallic material, for example, copper.

The first deformation regions A1 may have relatively low line-area ratio, and the second deformation regions A2 may have relatively high line-area ratio. The line-area ratio may mean a ratio of a total planar area of lines to unit area of a relevant region. For example, the line-area ratio of each of the first deformation regions A1 may fall within a range from 55 percent to 65 percent. The line-area ratio of each of the second deformation regions A2 may fall within a range from 65 percent to 80 percent.

The upper part UP of the fifth region RG5 may be the first deformation region A1. The upper part UP of the fifth region RG5 may have a first line-area ratio. For example, a planar area of the fifth region RG5 may be 100, and a sum of planar areas of the first lines 140a at the upper part UP of the fifth region RG5 may be 60 (i.e., an area of the first routing layer LA1 on the fifth region RG5 may be 60). In this case, the upper part UP of the fifth region RG5 may have a first line-area ratio of 60 percent.

The upper part UP of the sixth region RG6 may be the second deformation region A2. The upper part UP of the sixth region RG6 may have a second line-area ratio. For example, a planar area of the sixth region RG6 may be 100, and a sum of planar areas of the first lines 140a at the upper part UP of the sixth region RG6 may be 70 (i.e., an area of the first routing layer LA1 on the sixth region RG6 may be 70). In this case, the upper part UP of the sixth region RG6 may have a second line-area ratio of 70 percent.

The planar area of the fifth region RG5 may be substantially the same as the planar area of the sixth region RG6. The number of the first lines 140a in the first routing layer LA1 may be four on the fifth region RG5, and five on the sixth region RG6. Accordingly, the first line-area ratio of the upper part UP of the fifth region RG5 may be less than the second line-area ratio of the upper part UP of the sixth region RG6.

In contrast to the upper part UP of the fifth region RG5, the lower part LP of the fifth region RG5 may be the second deformation region A2. The lower part LP of the fifth region RG5 may have a third line-area ratio. For example, a planar area of the fifth region RG5 may be 100, and a sum of planar areas of the second lines 140b at the lower part LP of the fifth region RG5 may be 70 (i.e., an area of the second routing layer LA2 on the fifth region RG5 may be 70). In this case, the lower part LP of the fifth region RG5 may have a third line-area ratio of 70 percent.

On the fifth region RG5, the number of the first lines 140a in the first routing layer LA1 may be four, and the number of the second lines 140b in the second routing layer LA2 may be five. Accordingly, the first line-area ratio of the upper part UP of the fifth region RG5 may be less than the third line-area ratio of the lower part LP of the fifth region RG5.

In contrast to the upper part UP of the sixth region RG6, the lower part LP of the sixth region RG6 may be the first deformation region A1. The lower part LP of the sixth region RG6 may have a fourth line-area ratio. For example, a planar area of the sixth region RG6 may be 100, and a sum of planar areas of the second lines 140b at the lower part LP of the sixth region RG6 may be 60 (i.e., an area of the second routing layer LA2 on the sixth region RG6 may be 60). In this case, the lower part LP of the sixth region RG6 may have a fourth line-area ratio of 60 percent.

On the sixth region RG6, the number of the first lines 140a in the first routing layer LA1 may be five, and the number of the second lines 140b in the second routing layer LA2 may be four. Accordingly, the second line-area ratio of the upper part UP of the sixth region RG6 may be greater than the fourth line-area ratio of the lower part LP of the sixth region RG6.

The planar area of the fifth region RG5 may be substantially the same as the planar area of the sixth region RG6. The number of the second lines 140b in the second routing layer LA2 may be five on the fifth region RG5, and four on the sixth region RG6. Accordingly, the third line-area ratio of the lower part LP of the fifth region RG5 may be greater than the fourth line-area ratio of the lower part LP of the sixth region RG6 adjacent to the fifth region RG5.

Referring back to FIG. 4, since the line-area ratio of the upper part UP (or the first deformation region A1) of the fifth region RG5 is less than the line-area ratio of the lower part LP (or the second deformation region A2) of the fifth region RG5, the thermal strain occurred at the upper portion UP (or the first deformation region A1) of the fifth region RG5 may be less than the thermal strain occurred at the lower part LP (or the second deformation region A2) of the fifth region RG5. As such, the fifth region RG5 may experience a downward warpage (or warpage in a direction reverse to a third direction D3).

Since the line-area ratio of the upper part UP (or the second deformation region A2) of the sixth region RG6 is greater than the line-area ratio of the lower part LP (or the first deformation region A1) of the sixth region RG6, the thermal strain occurred at the upper part UP (or the second deformation region A2) of the sixth region RG6 may be greater than the thermal strain occurring at the lower part LP (or the first deformation region A1) of the sixth region RG6. As such, the sixth region RG6 may experience an upward warpage (or warpage in the third direction D3). In other words, the direction and degree of the warpage generated in the fifth region RG5 may be offset by the direction and degree of the warpage generated in the sixth region RG6.

Neighboring ones of the first to ninth regions RG1 to RG9 may have the same arrangement between the first and second deformation regions A1 and A2 as that between the first and second deformation regions A1 and A2 of the fifth and the sixth regions RG5 and RG6 as discussed above. For example, at the upper part UP of the printed circuit board 100, the neighboring ones of the first to ninth regions RG1 to RG9 may be the first deformation region A1 and the second deformation region A2. At the lower part UP of the printed circuit board 100, the neighboring ones of the first to ninth regions RG1 to RG9 may be the second deformation region A2 and the first deformation region A1. Accordingly, as illustrated in FIG. 4, at least one cross-section of the printed circuit board 100 may have a wave-shaped warpage structure Referring back to FIG. 5, a printed circuit board 100' according to a comparative example of inventive concepts is not divided into a plurality of regions. For example, an upper part UP' of the printed circuit board 100' may have no arrangement where first and second deformation regions are alternately disposed as discussed above. A lower part LP' of the printed circuit board 100' may have no arrangement where first and second deformation regions are alternately disposed as described above. In conclusion, the printed circuit board 100' according to a comparative example of inventive concepts may have an upward warpage alone (or warpage in the third direction D3), and in this case, the warpage degree of the printed circuit board 100' may be greater than the warpage degree of the printed circuit board 100 shown in FIG. 4 according to some embodiments of inventive concepts. For the printed circuit board 100 according to some embodiments of inventive concepts, neighboring regions may experience warpage in opposite directions. Therefore, it may be possible to minimize or reduce warpage of the printed circuit board 100 as a whole.

A detailed description about the rest of the regions RG1 to RG4 and RG7 to RG9, except for the fifth and sixth regions RG5 and RG6, may be substantially the same as or similar to that discussed above with reference to the fifth and sixth regions RG5 and RG6.

Figure 6:
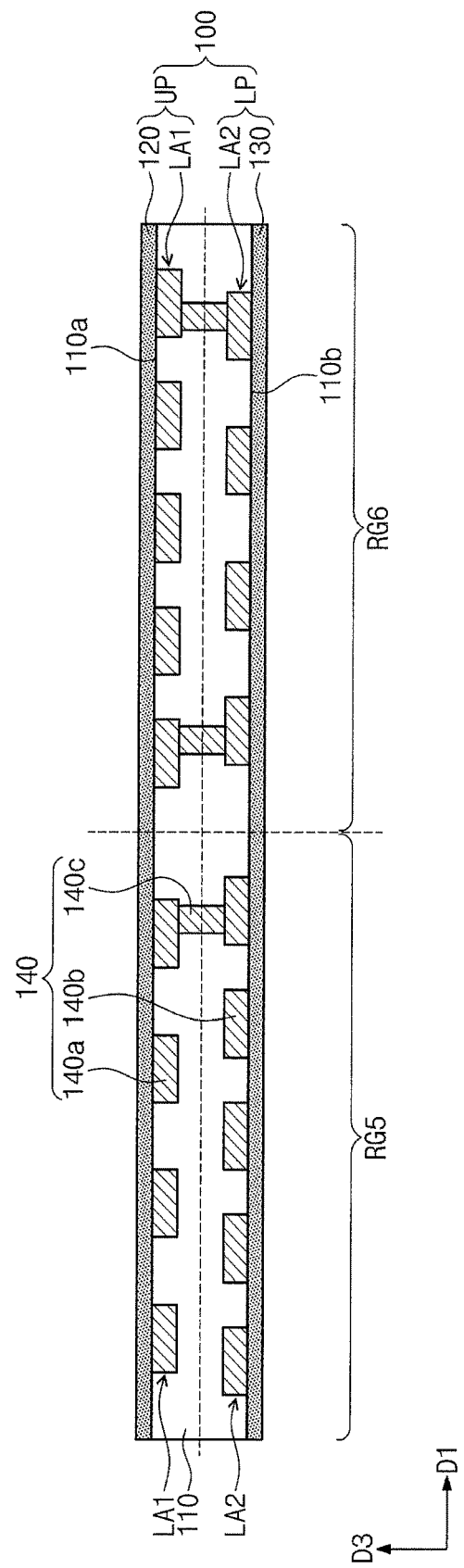
FIG. 6 illustrates a cross-sectional view taken along line A-A' of FIGS. 2A and 2B, showing a printed circuit board according to exemplary embodiments of inventive concepts.

FIG. 6 illustrates a cross-sectional view taken along line A-A' of FIGS. 2A and 2B, showing a printed circuit board according to exemplary embodiments of inventive concepts. In the embodiment that follows, a detailed description of technical features repetitive to those discussed above with reference to FIGS. 1, 2A, 2B, and 3 will be omitted, and a difference will be discussed in detail.

Referring to FIGS. 1, 2A, 2B, and 6, the lines 140 may be provided in the base layer 110. For example, the first routing layer LA1 and the second routing layer LA2 may be contained within the base layer 110. Top surfaces of the first lines 140*a* may be coplanar with the first surface 110*a* of the base layer 110. Bottom surfaces of the second lines 140*b* may be coplanar with the second surface 110*b* of the base layer 110. The first insulation layer 120 may cover the first surface 110*a* of the base layer 110 and the top surfaces of the first lines 140*a*. The second insulation layer 130 may cover the second surface 110*b* of the base layer 110 and the bottom surfaces of the second lines 140*b*.

Figure 7:
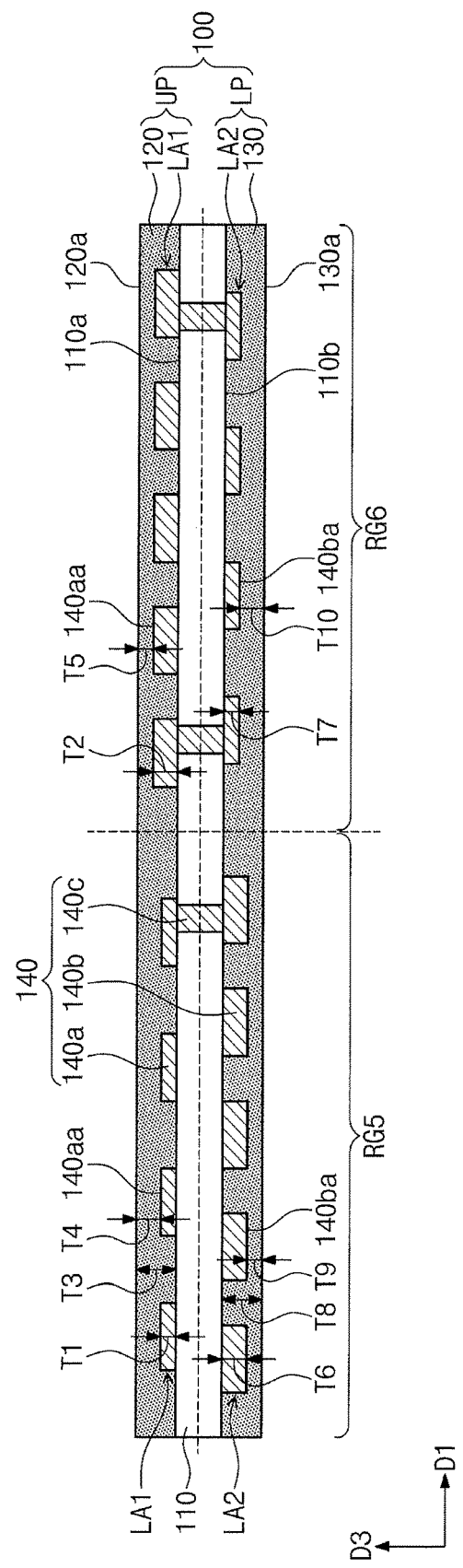
FIG. 7 illustrates a cross-sectional view taken along line A-A' of FIGS. 2A and 2B, showing a printed circuit board according to exemplary embodiments of inventive concepts.

FIG. 7 illustrates a cross-sectional view taken along line A-A' of FIGS. 2A and 2B, showing a printed circuit board according to exemplary embodiments of inventive concepts. In the embodiment that follows, a detailed description of technical features repetitive to those discussed above with reference to FIGS. 1, 2A, 2B, and 3 will be omitted, and a difference thereof will be discussed in detail.

Referring to FIGS. 1, 2A, 2B, and 7, each of the first lines 140*a* in the first routing layer LA1 on the fifth region RG5 may have a first thickness T1. Each of the first lines 140*a* in the first routing layer LA1 on the sixth region RG6 may have a second thickness T2. The first thickness T1 may be less than the second thickness T2. For example, thicknesses of lines in the first deformation region A1 may be less than thicknesses of lines in the second deformation region A2.

The first insulation layer 120 on the base layer 110 may have a third thickness T3. The first insulation layer 120 may have a first surface 120*a* exposed to the outside. A thickness between the first surface 110*a* of the base layer 110 and the first surface 120*a* of the first insulation layer 120 may be equal to the third thickness T3.

Each of the first lines 140*a* may have a first surface 140*aa* covered with the first insulation layer 120. On the fifth region RG5, a thickness between the first surface 120*a* of the first insulation layer 120 and the first surface 140*aa* of the first line 140*a* may be equal to a fourth thickness T4. On the sixth region RG6, a thickness between the first surface 120*a* of the first insulation layer 120 and the first surface 140*aa* of the first line 140*a* may be equal to a fifth thickness T5. The fourth thickness T4 may be greater than the fifth thickness T5. For example, a thickness of the first insulation layer 120 on the first line 140*a* may be greater in the first deformation region A1 than in the second deformation region A2.

Each of the second lines 140*b* in the second routing layer LA2 on the fifth region RG5 may have a sixth thickness T6. Each of the second lines 140*b* in the second routing layer LA2 on the sixth region RG6 may have a seventh thickness T7. The sixth thickness T6 may be greater than the seventh thickness T7. The sixth thickness T6 may also be greater than the first thickness T1. The seventh thickness T7 may be less than the second thickness T2.

The second insulation layer 130 on the base layer 110 may have an eighth thickness T8. The second insulation layer 130 may have a first surface 130*a* exposed outside the printed circuit board 100. A thickness between the first surface 110*a* of the base layer 110 and the first surface 130*a* of the second insulation layer 130 may be equal to the eighth thickness T8. The eighth thickness T8 may be substantially the same as the third thickness T3.

Each of the second lines 140*b* may have a first surface 140*ba* covered with the second insulation layer 130. On the fifth region RG5, a thickness between the first surface 130*a* of the second insulation layer 130 and the first surface 140*aa* of the second line 140*b* may be equal to a ninth thickness T9. On the sixth region RG6, a thickness between the first surface 130*a* of the second insulation layer 130 and the first surface 140*ba* of the second line 140*b* may be equal to a tenth thickness T10. The ninth thickness T9 may be less than the tenth thickness T10. The ninth thickness T9 may also be less than the fourth thickness T4. The tenth thickness T10 may be greater than the fifth thickness T5.

Figure 8:
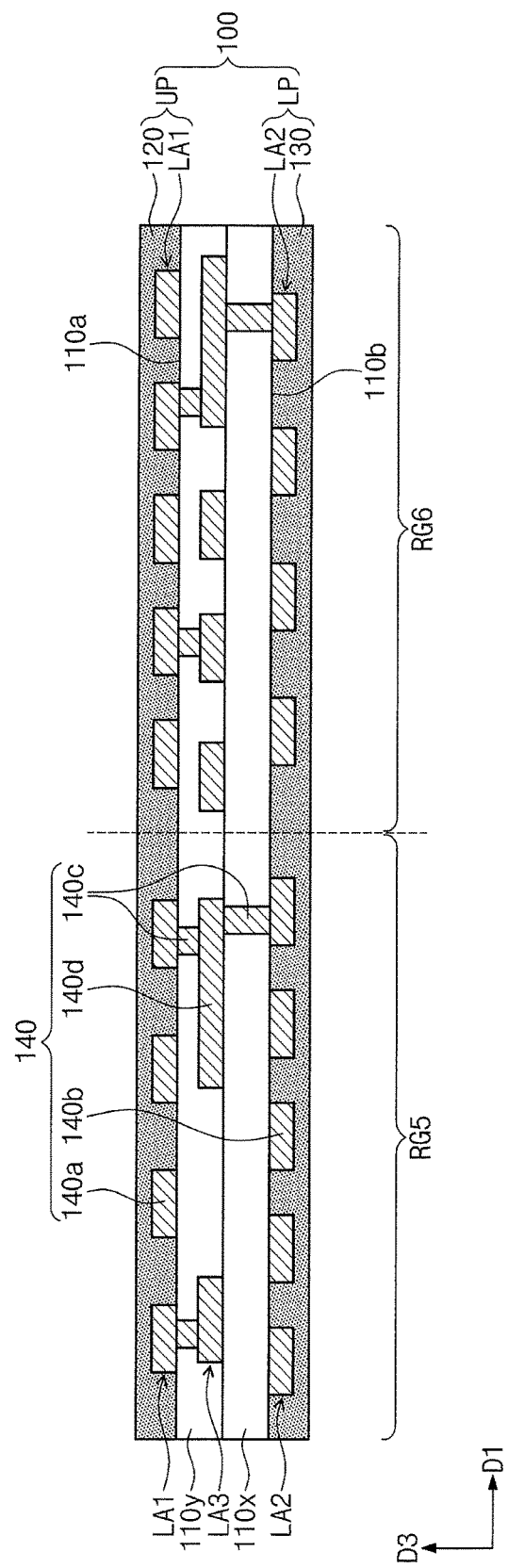
FIG. 8 illustrates a cross-sectional view taken along line A-A' of FIGS. 2A and 2B, showing a printed circuit board according to exemplary embodiments of inventive concepts.

FIG. 8 illustrates a cross-sectional view taken along line A-A' of FIGS. 2A and 2B, showing a printed circuit board according to exemplary embodiments of inventive concepts. In the embodiment that follows, a detailed description of technical features repetitive to those discussed above with reference to FIGS. 1, 2A, 2B, and 3 will be omitted, and a difference thereof will be discussed in detail.

Referring to FIGS. 1, 2A, 2B, and 8, a printed circuit board 100 may include a first base layer 110*x*, a second base layer 110*y*, a first insulation layer 120, a second insulation layer 130, and lines 140. A third routing layer LA3 may be provided between a first routing layer LA1 and a second routing layer LA2. The third routing layer LA3 may include third lines 140*d*. The third lines 140*d* may be provided in the second base layer 110*y*. For example, the third lines 140*d* may be contained within the second base layer 110*y*. Vias 140*c* may be provided between the first routing layer LA1 and the third routing layer LA3 and between the third routing layer LA3 and the second routing layer LA2. The printed circuit board 100 according to some embodiments of inventive concepts may include maximally three routing layers (the first routing layer LA1, the second routing layer LA2, and the third routing layer LA3).

FIGS. 9 to 12 illustrate cross-sectional views showing semiconductor packages according to exemplary embodiments of inventive concepts.

Figure 9:
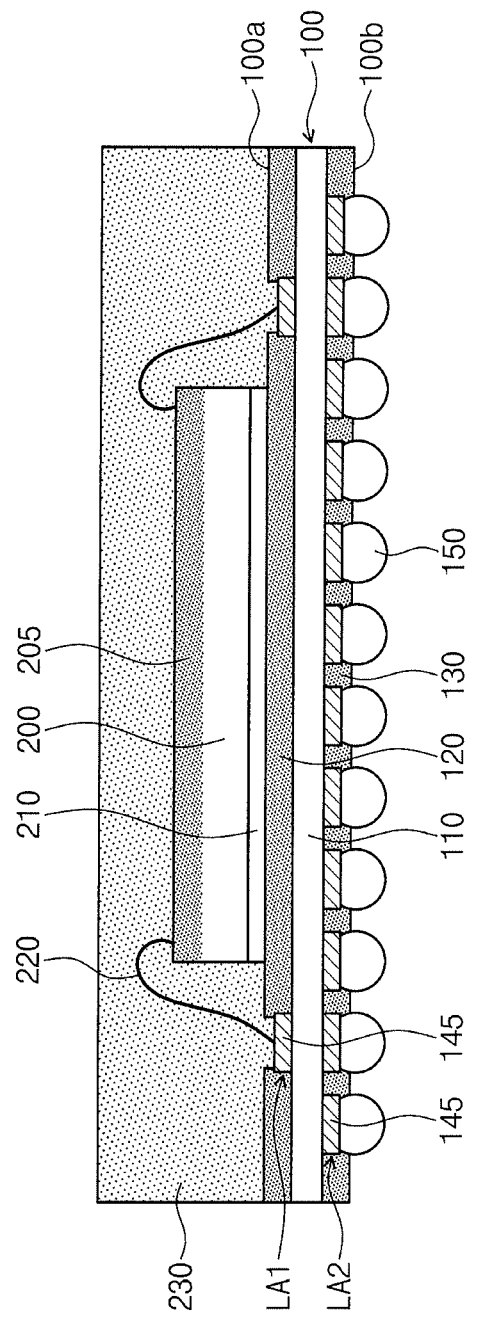
FIGS. 9 to 12 illustrate cross-sectional views showing semiconductor packages according to exemplary embodiments of inventive concepts.

Referring to FIG. 9, a semiconductor package according to some embodiments of inventive concepts may include a printed circuit board 100 and a first semiconductor chip 200 mounted on the printed circuit board 100. The printed circuit board 100 may be the same as that discussed above with reference to FIGS. 1, 2A, 2B, 3, and 4.

The printed circuit board 100 may have the first surface 100*a* and the second surface 100*b* opposite to each other. A plurality of first external terminals 150 may be provided on the second surface 100*b* of the printed circuit board 100. The first external terminals 150 may be adhered to pads 145 in a second routing layer LA2 of the printed circuit board 100. For example, each of the first external terminals 150 may be or include solder balls or solder bumps.

The first semiconductor chip 200 may be mounted on the first surface 100a of the printed circuit board 100. A glue layer 210 may be interposed between the printed circuit board 100 and the first semiconductor chip 200. A first molding layer 230 may be provided to cover the first semiconductor chip 200 and a portion of the first surface 100a of the printed circuit board 100. The first molding layer 230 may include an insulating polymer, for example, an epoxy-based polymer.

The first semiconductor chip 200 may include a first circuit layer 205 adjacent to an upper surface of the first semiconductor chip 200. The first circuit layer 205 may include transistors on a silicon substrate of the first semiconductor chip 200, and also include lines on the transistors. The first circuit layer 205 of the first semiconductor chip 200 may be electrically connected through bonding wires 220 to pads 145 in a first routing layer LA1 of the printed circuit board 100.

Figure 10:
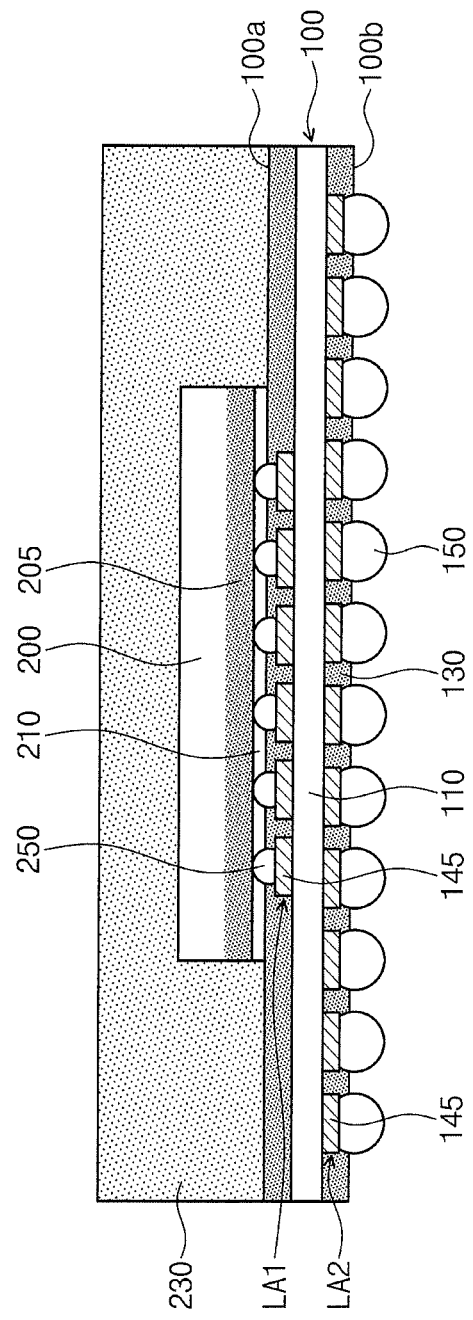

Referring to FIG. 10, a semiconductor package according to some embodiments of inventive concepts may include a printed circuit board 100 and a first semiconductor chip 200. In the embodiment that follows, a detailed description of technical features repetitive to those discussed above with reference to FIG. 9 will be omitted, and a difference thereof will be discussed in detail.

The first semiconductor chip 200 may be flip-chip mounted on the printed circuit board 100. The first circuit layer 205 of the first semiconductor chip 200 may face the first surface 100a of the printed circuit board 100. A plurality of second external terminals 250 may be provided between the printed circuit board 100 and the first semiconductor chip 200. The second external terminals 250 may be adhered to the pads 145 in the first routing layer LA1 of the printed circuit board 100. The second external terminals 250 may electrically connect the first routing layer LA1 of the printed circuit board 100 to the first circuit layer 205 of the first semiconductor chip 200.

A semiconductor package according to some embodiments of inventive concepts may include the printed circuit board 100 whose warpage is minimized or reduced to prevent a contact failure between the printed circuit board 100 and the first semiconductor chip 200. As a result, the semiconductor package as a whole may increase in reliability.

Figure 11:
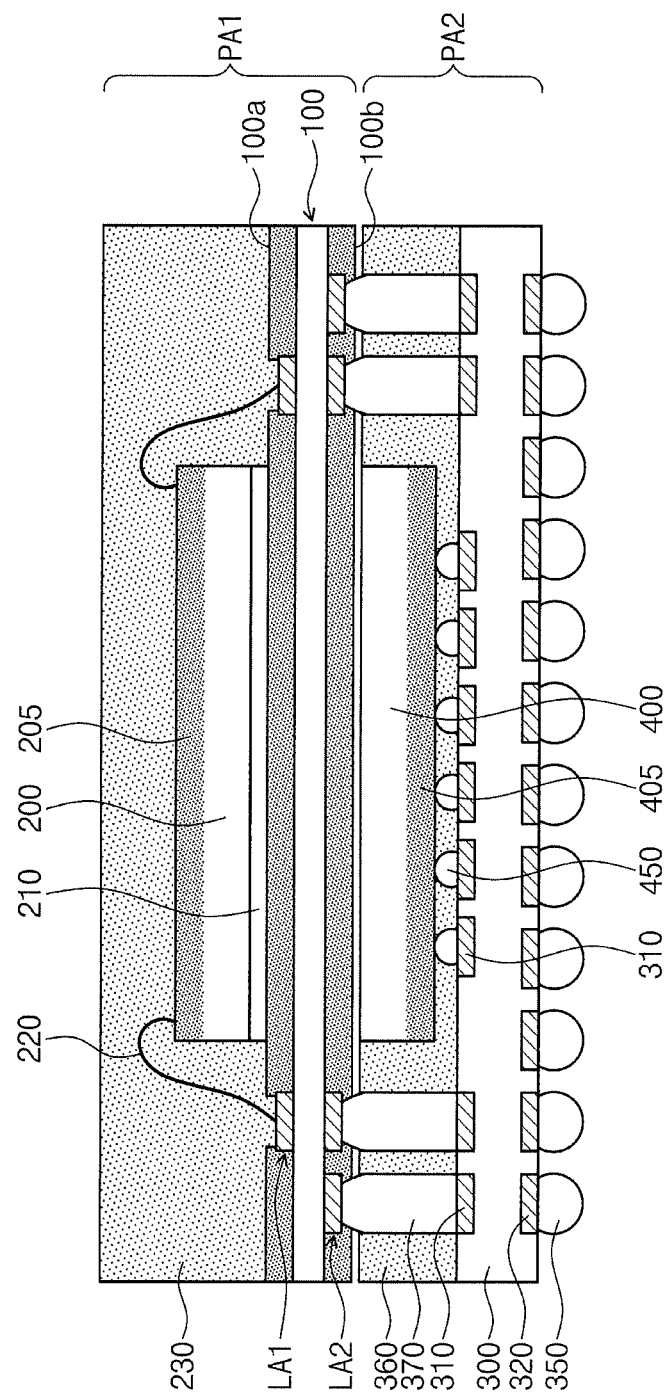

Referring to FIG. 11, a semiconductor package according to some embodiments of inventive concepts may include a lower package PA2 and an upper package PA1. The upper package PA1 may include a printed circuit board 100 and a first semiconductor chip 200. In the embodiment that follows, a detailed description of technical features repetitive to those discussed above with reference to FIG. 9 will be omitted, and a difference thereof will be discussed in detail.

The lower package PA2 may include a first package substrate 300 and a second semiconductor chip 400 mounted on the first package substrate 300. A plurality of third external terminals 350 may be provided on a bottom surface of the first package substrate 300. The third external terminals 350 may be adhered to lower pads 320 at a lower portion of the first package substrate 300. For example, each of the third external terminals 350 may be or include a solder ball or a solder bump.

The second semiconductor chip 400 may be flip-chip mounted on a top surface of the first package substrate 300. The second semiconductor chip 400 may include a second circuit layer 405 facing the top surface of the first package substrate 300. A plurality of fourth external terminals 450 may be provided between the first package substrate 300 and the second semiconductor chip 400. The fourth external terminals 450 may be adhered to upper pads 310 in an upper portion of the first package substrate 300. The first package substrate 300 and the second semiconductor chip 400 may be electrically connected to each other through the fourth external terminals 450. A second molding layer 360 may be provided to cover the second semiconductor chip 400 and the top surface of the first package substrate 300.

A plurality of fifth external terminals 370 may be provided between the printed circuit board 100 of the upper package PA1 and the first package substrate 300 of the lower package PA2. Bottoms of the fifth external terminals 370 may be adhered to the upper pads 310 at the upper portion of the first package substrate 300. Tops of the fifth external terminals 370 may be adhered to the pads (see 145 of FIG. 9) in the second routing layer LA2 of the printed circuit board 100. The lower package PA2 and the upper package PA1 may be electrically connected to each other through the fifth external terminals 370.

A detailed description of the upper package PA1 may be identical or similar to that discussed above with reference to FIG. 9. For example, the first semiconductor chip 200 may be or include a memory chip. The first semiconductor chip 200 may be one of a plurality. The plurality of first semiconductor chips 200 may be vertically stacked or two-dimensionally arranged. For example, the second semiconductor chip 400 may be or include a processor chip.

Figure 12:
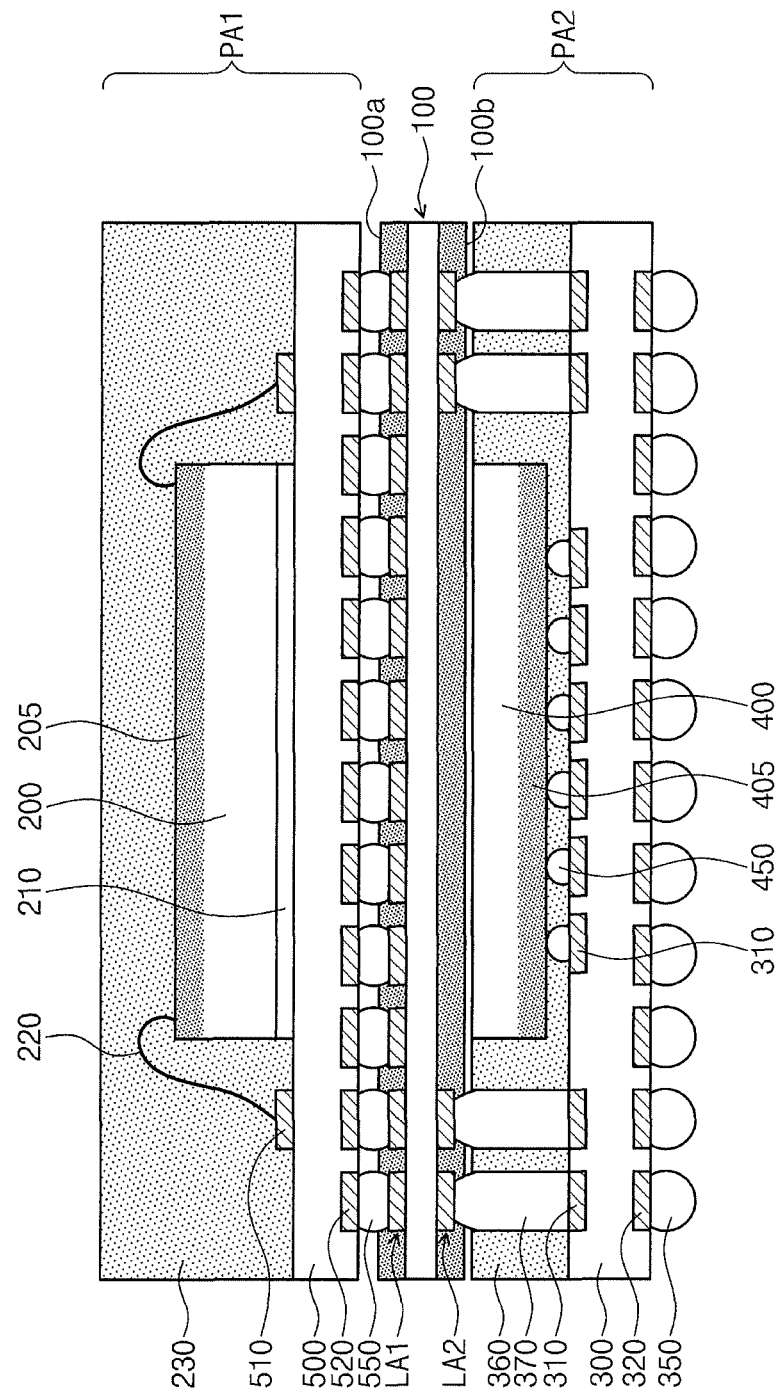

Referring to FIG. 12, a semiconductor package according to some embodiments of inventive concepts may include a lower package PA2, an upper package PA1, and a printed circuit board 100 between the lower and upper packages PA1 and PA2. The printed circuit board 100 may be the same as that discussed above with reference to FIGS. 1, 2A, 2B, 3, and 4. In the embodiment that follows, a detailed description of technical features repetitive to those discussed above with reference to FIGS. 9 and 11 will be omitted, and a difference thereof will be discussed in detail.

The upper package PA1 may include the second package substrate 500 and the first semiconductor chip 200 mounted on the second package substrate 500. A plurality of sixth external terminals 550 may be provided on a bottom surface of the second package substrate 500. The sixth external terminals 550 may be adhered to lower pads 520 at a lower portion of the second package substrate 500. The first semiconductor chip 200 and the second package substrate 500 may be electrically connected to each other through the bonding wires 220.

The fifth external terminals 370 may be adhered to the pads (see 145 of FIG. 9) in the second routing layer LA2 of the printed circuit board 100. The lower package PA2 and the printed circuit board 100 may be electrically connected to each other through the fifth external terminals 370. The sixth external terminals 550 may be interposed between the printed circuit board 100 and the upper package PA1. The sixth external terminals 550 may be adhered to the pads (see 145 of FIG. 9) in the first routing layer LA1 of the printed circuit board 100. The upper package PA1 and the printed circuit board 100 may be electrically connected to each other through the sixth external terminals 550. In conclusion, the upper and lower packages PA1 and PA2 may be electrically connected to each other through the printed circuit board 100 interposed therebetween.

A semiconductor package according to some embodiments of inventive concepts may include the printed circuit board 100 whose warpage is minimized or reduced to prevent contact failures between the printed circuit board 100 and the first package substrate 300 and between the printed circuit board 100 and the second package substrate 500. As a result, the semiconductor package as a whole may increase in reliability.

A printed circuit board and a semiconductor package including the same according to inventive concepts may be configured in such a way that neighboring regions experience warpage in opposite directions. Therefore, it may be possible to minimize or reduce warpage of the printed circuit board as a whole. The minimization in warpage of the printed circuit board may prevent contact failures between the printed circuit board and the semiconductor chip and/or between the printed circuit board and the package substrate. As a result, a semiconductor package as a whole may increase in reliability.

Although exemplary embodiments of inventive concepts have been discussed with reference to accompanying figures, it will be understood that various changes in form and details may be made therein without departing from the spirit and scope of inventive concepts. It therefore will be understood that the embodiments described above are just illustrative but not limitative in all aspects.

What is claimed:

1. A printed circuit board having a first region and a second region sharing a border with each other, the printed circuit board comprising:
   a base layer comprising a first surface and a second surface opposite to each other;
   a first routing layer on the first surface; and
   a second routing layer on the second surface, wherein
   the first routing layer is provided at an upper part of each of the first and second regions,
   the second routing layer is provided at a lower part of each of the first and second regions,
   the upper part of the first region has a first line-area ratio,
   the upper part of the second region has a second line-area ratio,
   the lower part of the first region has a third line-area ratio, and
   each of the second and third line-area ratios being greater than each of the first and fourth line-area ratios.

2. The printed circuit board of claim 1, wherein a size of the first region is substantially equal to a size of the second region.

3. The printed circuit board of claim 1, wherein
   the first line-area ratio is a ratio of an area of first lines in the first routing layer in the first region to an area of the first region,
   the second line-area ratio is a ratio of an area of second lines in the first routing layer in the second region to an area of the second region,
   the third line-area ratio is a ratio of an area of third lines in the second routing layer in the first region to the area of the first region, and
   the fourth line-area ratio is a ratio of an area of fourth lines in the second routing layer in the second region to the area of the second region.

4. The printed circuit board of claim 1, wherein the printed circuit board comprises no more than three routing layers.

5. The printed circuit board of claim 1, wherein a thickness of the first routing layer in the first region is different from a thickness of the first routing layer in the second region.

6. The printed circuit board of claim 1, wherein
   the first routing layer comprises first lines on the first surface of the base layer, and
   the second routing layer comprises second lines on the second surface of the base layer.

7. The printed circuit board of claim 6, further comprising a first insulation layer covering the first lines, wherein
   each of the first lines has a surface covered with the first insulation layer,
   the first insulation layer has a surface that is externally exposed, and
   a thickness between the surface of one of the first lines in the first region and the surface of the first insulation layer is different from a thickness between the surface of one of the first lines in the second region and the surface of the first insulation layer.

8. The printed circuit board of claim 1, wherein
   the first routing layer comprises first lines contained within the base layer, and
   the second routing layer comprises second lines contained within the base layer.

9. The printed circuit board of claim 1, wherein
   the first region is warped in a first direction, and
   the second region is warped in a second direction that is opposite to the first direction,
   the first and second directions being perpendicular to the first surface.

10. A printed circuit board that is divided into a plurality of regions, the printed circuit board comprising:
    a base layer comprising a first surface and a second surface opposite to each other;
    a first routing layer comprising a plurality of first lines on the first surface; and
    a second routing layer comprising a plurality of second lines on the second surface, wherein
    the plurality of regions comprises a first region and a second region sharing a border with each other,
    an area ratio of an area of first lines in the first region to an area of the first region is less than an area ratio of the first lines in the second region to an area of the second region, and
    an area ratio of an area of the second lines in the first region to the area of the first region is greater than an area ratio of an area of the second lines in the second region to the area of the second region.

11. The printed circuit board of claim 10, wherein
    the area ratio of the area of the first lines in the first region to the area of the first region is less than the area ratio of the area of the second lines in the first region to the area of the first region, and
    the area ratio of the area of the first lines in the second region to the area of the second region is greater than the area ratio of the area of the second lines in the second region to the area of the second region.

12. The printed circuit board of claim 10, wherein a size of the first region is substantially equal to a size of the second region.

13. The printed circuit board of claim 10, wherein a thickness of each of the first lines in the first region is different from a thickness of each of the first lines in the second region.

14. The printed circuit board of claim 10, wherein a thickness of each of the first lines in the first region is different from a thickness of each of the second lines in the first region.

15. The printed circuit board of claim 10, further comprising a first insulation layer covering the first lines, wherein each of the first lines has a surface covered with the first insulation layer, the first insulation layer has a surface that is externally exposed, and a thickness between the surface of one of the first lines in the first region and the surface of the first insulation layer is different from a thickness between the surface of one of the first lines in the second region and the surface of the first insulation layer.

16. The printed circuit board of claim 10, further comprising:

a first insulation layer covering the first lines; and a second insulation layer covering the second lines, wherein each of the first lines has a surface covered with the first insulation layer, each of the second lines has a surface covered with the second insulation layer, the first insulation layer has a surface that is externally exposed, the second insulation layer has a surface that is externally exposed, and a thickness between the surface of one of the first lines in the first region and the surface of the first insulation layer is different from a thickness between the surface of one of the second lines in the first region and the surface of the second insulation layer.

17. A semiconductor package, comprising:

a printed circuit board comprising a plurality of regions adjacent to each other; and a semiconductor chip on the printed circuit board, wherein the printed circuit board comprises:

a base layer having a first surface and a second surface opposite to each other;

a first routing layer comprising a plurality of first lines on the first surface; and a second routing layer comprising a plurality of second lines on the second surface, wherein the plurality of regions comprises a first region and a second region adjacent to each other and sharing a border with each other, an area ratio of an area of the first lines in the first region to area of the first region is less than an area ratio of an area of the second lines in the first region to the area of the first region, and an area ratio of an area of the first lines in the second region to an area of the second region is greater than an area ratio of an area of the second lines in the second region to an area of the second region.

18. The semiconductor package of claim 17, wherein the printed circuit board comprises no more than three routing layers.

19. The semiconductor package of claim 17, wherein the plurality of regions in the printed circuit board comprise at least nine regions.

20. The semiconductor package of claim 17, wherein a size of the first region is substantially equal to a size of the second region.

* * * * *

UNITED STATES PATENT AND TRADEMARK OFFICE
CERTIFICATE OF CORRECTION

| | |
|---|---|
| PATENT NO. | : 10,506,706 B2 |
| APPLICATION NO. | : 15/966762 |
| DATED | : December 10, 2019 |
| INVENTOR(S) | : Shle-Ge Lee and Youngbae Kim |

It is certified that error appears in the above-identified patent and that said Letters Patent is hereby corrected as shown below:

In the Claims

Column 11 Line 42 Claim 1 Insert:
--the lower part of the second region has a fourth line-area ratio,--

Signed and Sealed this
Thirty-first Day of January, 2023

Katherine Kelly Vidal
*Director of the United States Patent and Trademark Office*